(12) United States Patent
Qi et al.

(10) Patent No.: US 11,962,357 B2
(45) Date of Patent: Apr. 16, 2024

(54) METHOD AND SYSTEM FOR TESTING WIRELESS PERFORMANCE OF WIRELESS TERMINAL

(71) Applicant: GENERAL TEST SYSTEMS INC., Guangdong (CN)

(72) Inventors: Yihong Qi, Guangdong (CN); Wei Yu, Guangdong (CN); Penghui Shen, Guangdong (CN)

(73) Assignee: GENERAL TEST SYSTEMS INC., Guangdong (CN)

( * ) Notice: Subject to any disclaimer, the term of this patent is extended or adjusted under 35 U.S.C. 154(b) by 393 days.

(21) Appl. No.: 17/330,936

(22) Filed: May 26, 2021

(65) Prior Publication Data

US 2021/0314075 A1 Oct. 7, 2021

Related U.S. Application Data

(63) Continuation of application No. PCT/CN2019/115544, filed on Nov. 5, 2019.

(30) Foreign Application Priority Data

Nov. 26, 2018 (CN) .......................... 201811417925.0

(51) Int. Cl.
*H04B 17/15* (2015.01)
*H04B 7/0413* (2017.01)
*H04B 17/29* (2015.01)

(52) U.S. Cl.
CPC ........... *H04B 17/15* (2015.01); *H04B 7/0413* (2013.01); *H04B 17/29* (2015.01)

(58) Field of Classification Search
CPC ...... H04B 17/15; H04B 7/0413; H04B 17/29; H04B 17/0087; H04B 17/16; H04B 17/3912; G01R 29/105
See application file for complete search history.

(56) References Cited

U.S. PATENT DOCUMENTS 9,742,508 B1 * 8/2017 Kyosti .............. H04B 17/3911
9,866,294 B1 * 1/2018 Bartko .............. H04B 17/0085
(Continued)

FOREIGN PATENT DOCUMENTS

CN    103856272    6/2014
KR    20180111958   10/2018
(Continued)

OTHER PUBLICATIONS

KIPO, Office Action for KR Application No. 10-2021-7019827, dated Feb. 16, 2022.
(Continued)

*Primary Examiner* — Jinsong Hu
*Assistant Examiner* — Rui M Hu
(74) *Attorney, Agent, or Firm* — Hodgson Russ LLP

(57) ABSTRACT

The present disclosure provides a method and system for testing wireless performance of a wireless terminal configured as a DUT having multiple transmitting antennas and placed in an anechoic chamber. The method includes: obtaining antenna pattern of the multiple transmitting antennas, and importing the antenna pattern into a channel emulator; selecting a same number of testing antennas in the anechoic chamber as a number of the transmitting antennas; the selected testing antennas receiving a signal from the transmitting antennas, and sending the signal to the channel emulator, the channel emulator processing the signal to generate an analog signal and sending the analog signal to an analog base station; and the analog base station receiving the analog signal and performing a throughput test to obtain an uplink wireless performance test of the DUT.

14 Claims, 8 Drawing Sheets

(56) References Cited

U.S. PATENT DOCUMENTS

| | | | | |
|---|---|---|---|---|
| 10,110,326 B1* | 10/2018 | Kyrolainen | | H04B 17/29 |
| 11,329,364 B2* | 5/2022 | Suzuki | | H01Q 21/24 |
| 2004/0042556 A1* | 3/2004 | Medvedev | | H04L 1/0071 |
| | | | | 375/295 |
| 2004/0085939 A1* | 5/2004 | Wallace | | H04W 52/50 |
| | | | | 370/335 |
| 2010/0248656 A1* | 9/2010 | Zhou | | H04B 7/0874 |
| | | | | 455/101 |
| 2011/0058620 A1* | 3/2011 | Gerlach | | H04B 17/0085 |
| | | | | 375/267 |
| 2011/0200084 A1* | 8/2011 | Griesing | | H01Q 3/267 |
| | | | | 375/224 |
| 2011/0223869 A1* | 9/2011 | Harteneck | | H04B 17/0087 |
| | | | | 455/67.11 |
| 2011/0230143 A1* | 9/2011 | Lundstrom | | H04W 24/06 |
| | | | | 455/67.11 |
| 2011/0270567 A1* | 11/2011 | Mow | | H04B 17/0087 |
| | | | | 702/120 |
| 2012/0098713 A1* | 4/2012 | Mow | | H04B 17/0087 |
| | | | | 343/703 |
| 2012/0100813 A1* | 4/2012 | Mow | | H04B 17/16 |
| | | | | 455/67.12 |
| 2012/0309323 A1* | 12/2012 | Guo | | H04B 17/0087 |
| | | | | 455/67.14 |
| 2013/0006601 A1* | 1/2013 | Mlinarsky | | H04W 24/06 |
| | | | | 703/23 |
| 2013/0027256 A1* | 1/2013 | Guo | | H04W 24/06 |
| | | | | 343/703 |
| 2013/0059545 A1* | 3/2013 | Kyosti | | H04B 17/391 |
| | | | | 455/67.12 |
| 2013/0295857 A1* | 11/2013 | Nuutinen | | H04B 17/391 |
| | | | | 455/67.12 |
| 2013/0303089 A1* | 11/2013 | Wang | | H04W 24/06 |
| | | | | 455/67.12 |
| 2014/0087668 A1* | 3/2014 | Mow | | H04W 24/08 |
| | | | | 455/67.14 |
| 2014/0098846 A1* | 4/2014 | Emmanuel | | H04B 5/73 |
| | | | | 375/224 |
| 2014/0134957 A1* | 5/2014 | Foegelle | | H04W 24/00 |
| | | | | 455/67.12 |
| 2014/0161164 A1* | 6/2014 | Emmanuel | | H04B 17/10 |
| | | | | 375/224 |
| 2015/0017928 A1* | 1/2015 | Griesing | | H04B 17/0085 |
| | | | | 455/67.14 |
| 2015/0215053 A1* | 7/2015 | Kyosti | | H04B 7/086 |
| | | | | 455/67.16 |
| 2015/0280844 A1* | 10/2015 | Yu | | H04B 17/0085 |
| | | | | 375/224 |
| 2016/0212641 A1* | 7/2016 | Kong | | H04B 17/0087 |
| 2016/0226709 A1* | 8/2016 | Chen | | H04B 17/318 |
| 2016/0233970 A1* | 8/2016 | Reed | | H04B 17/12 |
| 2017/0359739 A1* | 12/2017 | Reed | | H04W 16/28 |
| 2017/0373773 A1* | 12/2017 | Jing | | H04B 17/102 |
| 2018/0062971 A1* | 3/2018 | Kyosti | | H04L 43/50 |
| 2018/0337738 A1* | 11/2018 | Wen | | H04B 17/309 |
| 2019/0103926 A1* | 4/2019 | Chen | | H04B 17/102 |
| 2019/0115988 A1* | 4/2019 | Li | | H04L 27/2605 |
| 2019/0115989 A1* | 4/2019 | Rodriguez-Herrera | | H04B 17/11 |
| 2019/0253158 A1* | 8/2019 | Rowell | | G01R 29/105 |
| 2020/0191848 A1* | 6/2020 | Grossmann | | H04B 17/12 |
| 2020/0213018 A1* | 7/2020 | Qi | | H04B 17/15 |
| 2021/0373060 A1* | 12/2021 | Kiiskilä | | H01Q 3/267 |

FOREIGN PATENT DOCUMENTS

| | | |
|---|---|---|
| KR | 20180114181 | 10/2018 |
| WO | 2017166201 A1 | 10/2017 |

OTHER PUBLICATIONS

Shen et al., "OTA Measurement for IoT Wireless Device Performance Evaluation: Challenges and Solutions," IEEE Internet of Things Journal, Feb. 2019, vol. 6, No. 1.

JPO, Office Action for JP Application No. 2021-529865, dated Feb. 14, 2023.

SIPO, Office Action, CN application No. 201811417925.0, dated Sep. 23, 2020.

WIPO, International Search Report for PCT/CN2019/115544, dated Feb. 5, 2020.

* cited by examiner

US 11,962,357 B2

METHOD AND SYSTEM FOR TESTING WIRELESS PERFORMANCE OF WIRELESS TERMINAL

CROSS-REFERENCE TO RELATED APPLICATIONS

This application is a continuation of International Application No. PCT/CN2019/115544, filed Nov. 5, 2019, which claims priority to Chinese Patent Application No. 201811417925.0, filed Nov. 26, 2018, the entire disclosures of which are incorporated herein by reference.

TECHNICAL FIELD

The present disclosure relates to a field of wireless communication technology, and more particularly, to a method and a system for testing wireless performance of a wireless terminal.

BACKGROUND

For the reception performance of a MIMO wireless terminal (that is, downlink MIMO performance), two standard OTA test solutions, i.e., Multiple Probe Anechoic Chamber (MPAC) method and Radiated Two Stage (RTS) method are provided. The most critical index for evaluating the performance of downlink MIMO is the throughput rate. MIMO uses diversity technology to increase the communication rate. The electromagnetic wave space propagation environment (that is, the channel model) is an important factor that determines its throughput rate. RTS has gradually become the most mainstream MIMO test method.

SUMMARY

Embodiments of the present disclosure provides a method for testing wireless performance of a wireless terminal. A device under test (DUT) is configured as the wireless terminal. The DUT has a plurality of transmitting antennas and is placed in an anechoic chamber, the method includes the following steps.

Antenna pattern of the plurality of the transmitting antennas of the DUT is obtained, and the antenna pattern is imported into a channel emulator.

A same number of testing antennas in the anechoic chamber as a number of the transmitting antennas of the DUT is selected, so that the transmitting antennas of the DUT transmit signals to the selected testing antennas to generate a propagation channel matrix between the transmitting antennas of the DUT and the selected testing antennas.

The selected testing antennas receives a signal from the transmitting antennas of the DUT, and the testing antenna input port signal is transmitted to the channel emulator, the channel emulator processes the signal to generate an analog signal and sends the analog signal to an analog base station.

The analog base station receives the analog signal and performs a throughput test to obtain an uplink wireless performance of the DUT.

Embodiments of the present disclosure provide a system for testing wireless performance of a wireless terminal. The system for testing wireless performance of the wireless terminal includes an anechoic chamber, testing antennas, a channel emulator, and an analog base station.

The anechoic chamber is configured to place the testing antennas and a device under test.

The testing antennas are configured to receive a signal transmitted by a transmitting antenna of the device under test.

The channel emulator is configured to receive a signal from the testing antennas, process the signal to obtain an analog signal, and send the analog signal to the analog base station.

The analog base station is configured to receive the analog signal, perform a throughput test to obtain an uplink wireless performance of the DUT.

Embodiments of the present disclosure provide a non-transitory computer-readable storage medium, having stored therein instructions that, when executed by a processor, causes the processor to perform the method for testing wireless performance of a wireless terminal according to the above embodiments. The wireless terminal is configured as a device under test (DUT), the DUT has a plurality of transmitting antennas and is placed in an anechoic chamber.

Additional aspects and advantages of the present disclosure will be given in part in the following description, part of which will become apparent from the following description, or be learned through practice of the present disclosure.

BRIEF DESCRIPTION OF THE DRAWINGS

The above and/or additional aspects and advantages of embodiments of the present disclosure will become apparent and more readily appreciated from the following descriptions made with reference to the drawings.

DETAILED DESCRIPTION

Figure 1:
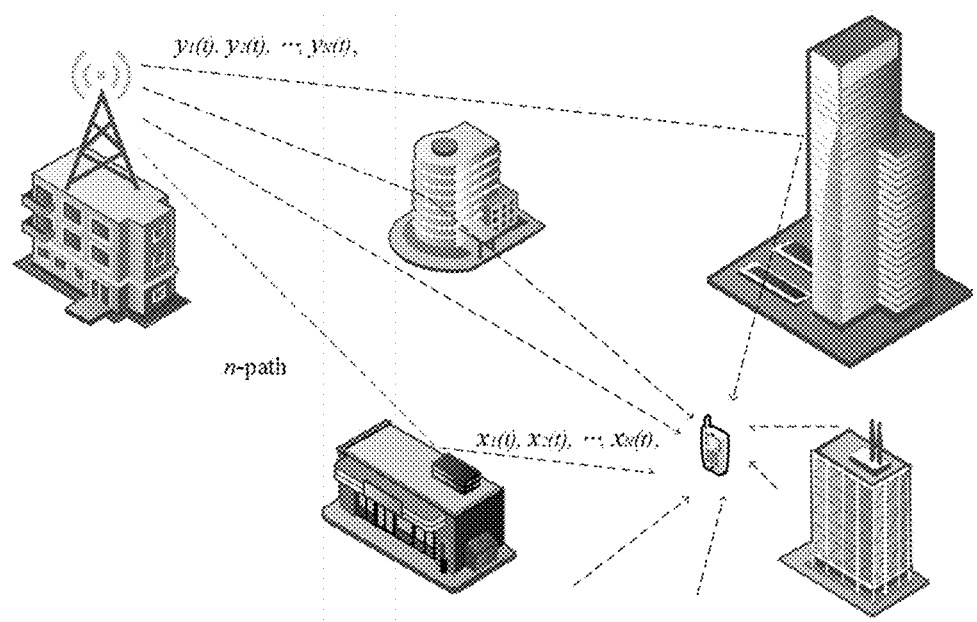
FIG. 1 is a schematic diagram of a multi-path environment in which a wireless terminal is located in the background section.
Figure 2:
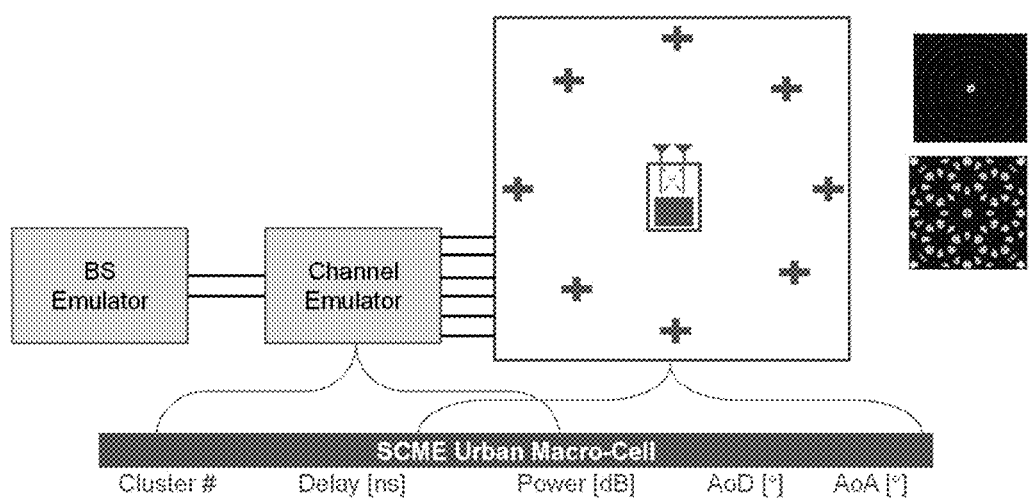
FIG. 2 is a schematic diagram of a Multiple Probe Anechoic Chamber (MPAC) method for testing a wireless terminal in the background section.
Figure 3:
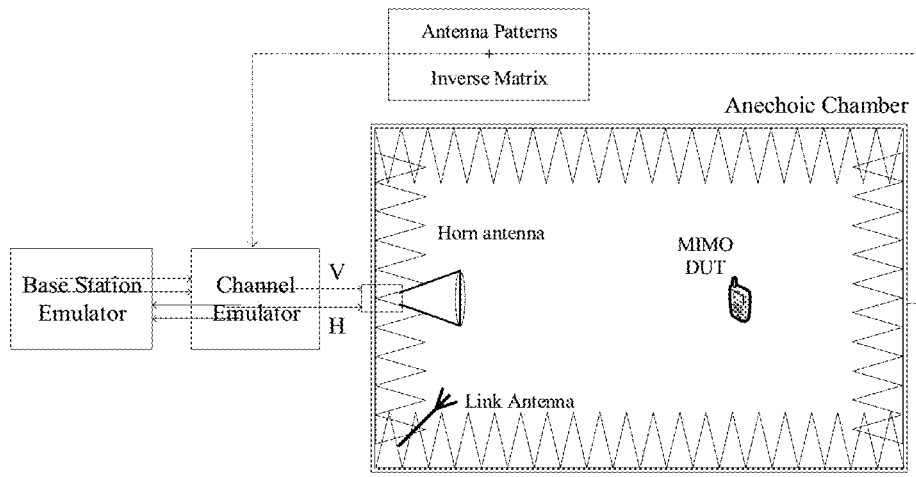
FIG. 3 is a schematic diagram of a Radiated Two Stage (RTS) method for testing a wireless terminal in the background section.

For the receiving performance of a MIMO wireless terminal (that is, downlink MIMO performance), two standard OTA test solutions, i.e., Multiple Probe Anechoic Chamber (MPAC) method and Radiated Two Stage (RTS) method are provided. The most critical index for evaluating the performance of downlink MIMO is the throughput rate. MIMO uses diversity technology to increase the communication rate. The electromagnetic wave space propagation environment (that is, the channel model) is an important factor that determines its throughput rate. FIG. 1 illustrates a multipath environment in which a wireless MIMO terminal is located, which includes a direct path from the base station to the terminal, a transmission path of each building, and the Doppler effect. The MIMO OTA test needs to simulate a specified channel model, and then the throughput rate is tested under the model. As illustrated in FIG. 2, the MPAC method adopts a plurality of antennas (such as 16 antennas) around a DUT (device under test) together with a channel emulator to simulate the MIMO channel, which is an intuitive method. However, the system cost is very high and the system calibration is complicated. The first step of the RTS method is acquiring a receiving antenna pattern of the DUT. The second step is generating a throughput rate test signal based on the acquired receiving antenna pattern in combination with the channel model, and then the throughput test signal is fed to a corresponding receiver by radiation to perform a throughput test. The RTS method uses simple and efficient hardware, with small system errors and high system stability, as illustrated in FIG. 3. Due to its advantages in various aspects, RTS has gradually become the most mainstream MIMO test method.

Wireless terminal testing is not only concerned with reception performance, but also transmission performance. Currently, downlink MIMO testing is standardized and industrialized. However, uplink MIMO performance tests for MIMO wireless terminals are still being explored.

Thus, the present disclosure provides a method and a system for testing wireless performance of a wireless terminal.

The following describes a method for testing wireless performance of a wireless terminal according to the first aspect of an embodiment of the present disclosure with reference to the drawings. A device under test (DUT) 200 (i.e., the wireless terminal) has a plurality of transmitting antennas 201 and the DUT 200 is placed in an anechoic chamber 301. Similarly, the number of testing antennas 302 placed in the anechoic chamber 301 is equal to the number of the transmitting antennas 201 of the DUT 200.

Figure 4:
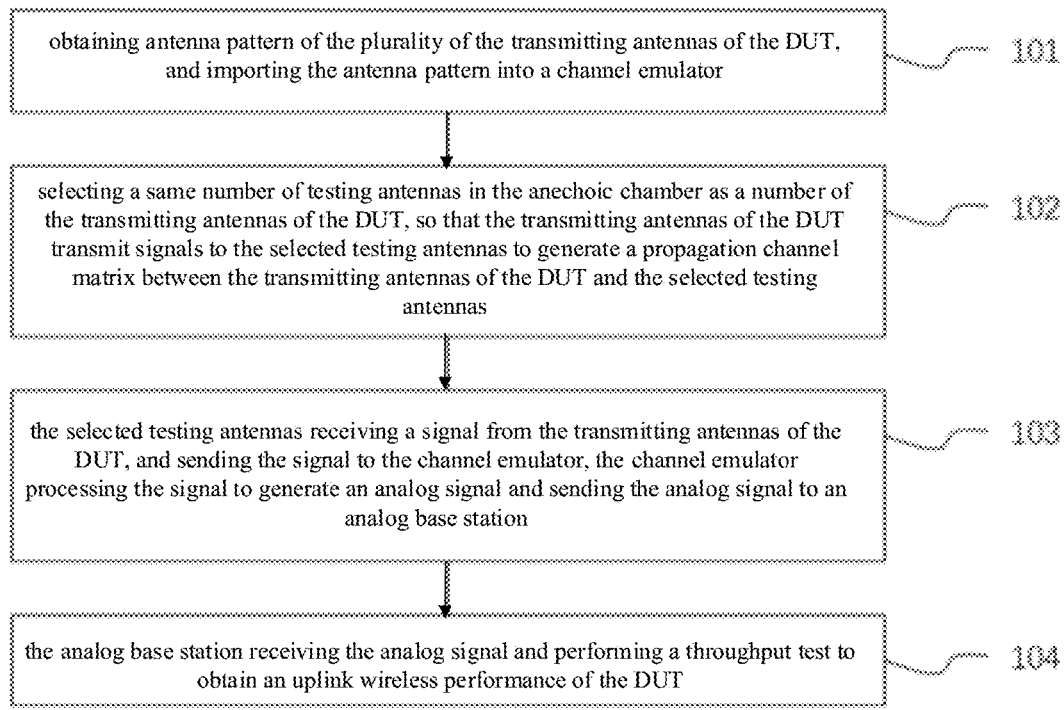
FIG. 4 is a flowchart of a method for testing wireless performance of a wireless terminal according to an embodiment of the present disclosure.

As illustrated in FIG. 4, the method for testing wireless performance of a wireless terminal includes the following steps.

At block 101, antenna pattern information of the plurality of transmitting antennas 201 of the DUT 200 is obtained and imported into a channel emulator 304.

At block 102, a same number of testing antennas 302 in the anechoic chamber 301 as a number of the transmitting antennas 201 of the DUT 200 is selected, so that the transmitting antennas 201 of the DUT 200 transmit signals to the selected testing antennas 302 to generate a propagation channel matrix from an output port of the transmitting antennas 201 of the DUT 200 to an input port 303 of the selected testing antennas.

At block 103, the input port 303 of the selected testing antennas receives transmitting antenna output port signals from the output port 202 of the transmitting antennas of the DUT 200 to generate testing antenna input port signals, and the testing antenna input port signals are transmitted to the channel emulator 304, such that the channel emulator 304 processes the testing antenna input port signals to obtain an analog signal and sends the analog signal to an analog base station 305.

At block 104, the analog base station 305 receives the feed signal, performs a throughput test, and implements an uplink wireless performance test on the DUT.

The method for testing wireless performance of the wireless terminal according to the embodiment of the first aspect will be described in detail below with reference to the accompanying drawings.

At block 101, the antenna pattern information of the plurality of transmitting antennas 201 of the DUT 200 is obtained and imported into a channel emulator 304. The antenna pattern is one of the important performance indicators of the antenna, and the antenna pattern information includes information such as the pattern, antenna gain, and phase difference. A method for obtaining the antenna pattern information of two transmitting antennas 201 of the DUT 200 is described below by taking a 2×2 MIMO wireless terminal as an example of the DUT 200.

Figure 5:
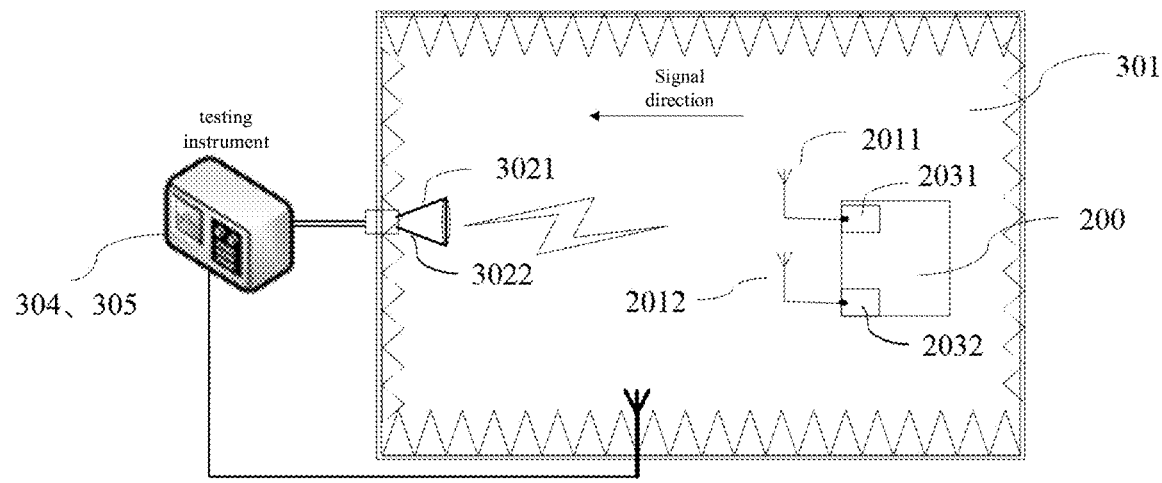
FIG. 5 is a schematic diagram of a method for acquiring transmitting antenna pattern information according to an embodiment of the present disclosure.

In detail, as illustrated in FIG. 5, the antenna pattern information can be obtained by testing the transmitting antennas 201 of the DUT 200 through adjusting a relative position between the DUT 200 and the testing antennas 302 placed in the anechoic chamber 301. The antenna pattern information is obtained by testing the transmitting antennas 201 of the DUT 200. The DUT 200 has two transmitting antennas 201 (i.e., a transmitting antenna 2011 and a transmitting antenna 2012), and two transmitters 203 (i.e., a transmitter 2031 and a transmitter 2032). Meanwhile, a same number of testing antennas 302 as the number of the transmitting antennas 201 is selected, i.e., a testing antenna 3021 and a testing antenna 3022.

Firstly, the transmitters 203 and the transmitting antenna 201 of the DUT 200, and the testing antennas 302 are turned on. Gain of each transmitting antenna 201 of the DUT 200 is obtained. That is, gain of the transmitting antenna 2011 and the transmitting antenna 2012 is obtained. In detail, each time the DUT 200 turns on one transmitter 203 separately, antenna gain of a transmitting antenna 201 corresponding to the turned-on transmitter 203 can be calculated by the following formula (1). That is, by turning on the transmitter 2031, the antenna gain of the transmitting antenna 2011 can be tested and calculated, and by turning on the transmitter 2032, the antenna gain of the transmitting antenna 2012 can be tested and calculated.

$$G = P_r - PL - P_o \tag{1}$$

In the above formula (1), a transmitting power of the transmitter 203 is $P_o$, a total path loss (including the gain of the testing antenna 302 and link loss) of the anechoic chamber 301 is PL, receiving power of the testing instrument (such as a testing instrument integrated the channel emulator 304 and the analog base station 305) is $P_r$, the antenna gain G of the transmitting antennas 2011 and 2012 can be calculated respectively. The parameters in formula 1 are in a dB format.

Secondly, the transmitting antennas 201 and the transmitters 203 of the DUT 200, and the testing antennas 302 are turned on. The DUT 200 and the testing antennas 302 in the anechoic chamber 301 are rotated, and a phase difference of the transmitting signals of the transmitting antennas 201 at each angle before and after the rotation can be obtained. For example, at a certain angle, by turning on the transmitter 2031 and the testing instrument (such as a testing instrument integrated the channel emulator 304 and the analog base station 305), an amplitude $P_1$ corresponding to the receiving power of the testing instrument is obtained, by turning on the transmitter 2032 and the testing instrument, an amplitude $P_2$ corresponding to the receiving power of the testing instrument is obtained, and by simultaneously turning on the transmitter 2031, the transmitter 2032 and the testing instrument, an amplitude $P_a$ corresponding to the receiving power of the testing instrument is obtained. Then, at this angle, a relationship among the phase difference θ between the transmitting antenna 2011 and the transmitting antenna 2012, $P_1$, $P_2$ and $P_a$ are illustrated as formula (2), in which the DUT 200 and the testing antennas 302 can be rotated repeatedly according to the testing requirements.

$$P_a = \sqrt{P_1^2 + P_2^2 - 2*P_1*P_2\cos(\pi-\theta)} \qquad (2)$$

The antenna gain information of the transmitting antenna 2011 and the transmitting antenna 2012 of the DUT 200 is obtained through the above method, and the phase difference information between the transmitting antenna 2011 and the transmitting antenna 2012 before the rotation and the phase difference information between the transmitting antenna 2011 and the transmitting antenna 2012 after the rotation can be obtained. The antenna pattern information of the transmitting antenna 201 is obtained according to the above information, and imported into the channel emulator 304.

Figure 6:
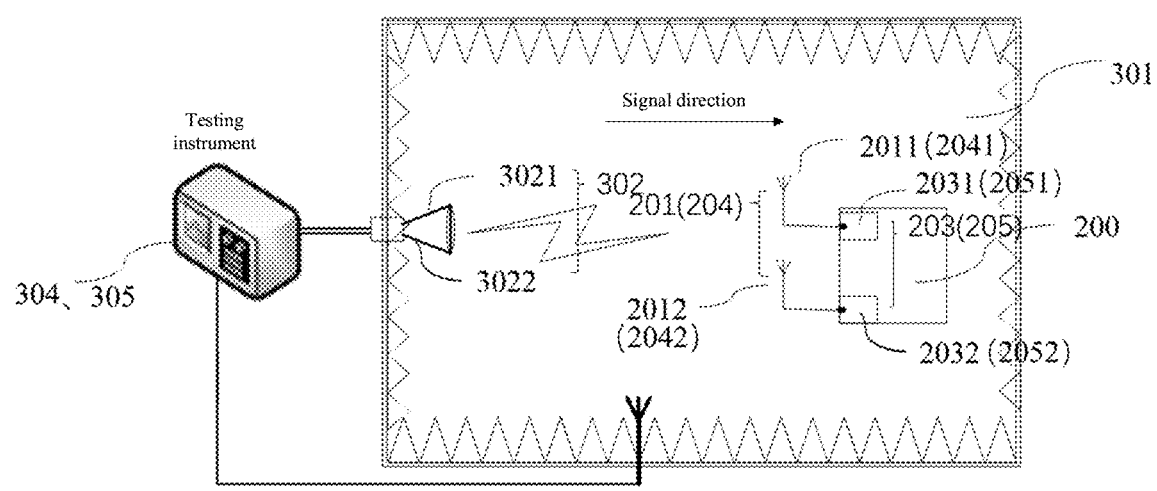
FIG. 6 is a schematic diagram of a method for acquiring transmitting antenna pattern information according to another embodiment of the present disclosure.

Meanwhile, as illustrated in FIG. 6, for a wireless terminal that transmits and receives signals at the same frequency, the antenna pattern information of the transmitting antenna 201 of the DUT 200 and the antenna pattern information of the receiving antenna 204 of the DUT 200 are the same. Therefore, the antenna pattern information can also be obtained by testing the receiving antenna 204 of the DUT 200. That is, the pattern information of the receiving antenna 204 of the DUT 200 is the same as the pattern information of the transmitting antenna 201 of the DUT 200. The DUT 200 has two receiving antennas 204 (i.e., a receiving antenna 2041 and a receiving antenna 2042), and two receivers 205 (i.e., a receiver 2051 and a receiver 2052). Meanwhile, the same number of testing antennas 302, i.e., a testing antenna 3021 and a testing antenna 3022, as the number of the transmitting antennas 201 is selected.

Firstly, the receiver 205 and the receiving antennas 204 of the DUT 200, and the testing antenna 302 are turned on, and gain of each receiving antenna 204 of the DUT 200 is obtained, that is, the gain of the receiving antenna 2041 and the receiving antenna 2042 is obtained. In detail, it is only necessary to open one testing antenna 302 separately, for example, opening the testing antenna 3021, to read reports of the receiver 2051 and the receiver 2052, and gains of the receiving antenna 2041 and the receiving antenna 2042 are calculated respectively based on formula (3).

$$G = P_{Rss} - PL - P_u \qquad (3)$$

where, $P_{Rss}$ is a reporting power of the receiver 205, $P_u$ is a transmitting power of the testing instrument (such as a testing instrument integrated the channel emulator 304 and the analog base station 305), the total path loss (including the gain of the testing antenna 302 and the link loss) of the anechoic chamber 301 is PL, then the antenna gain G of the receiving antenna 2011 and the receiving antenna 2012 can be calculated respectively. The obtained gain of the receiving antenna 2041 is equal to the gain of the transmitting antenna 2011, and the obtained gain of the receiving antenna 2042 is equal to the gain of the transmitting antenna 2012. The parameters in formula (3) is in a dB format.

Secondly, the receiver 205 and the receiving antenna 204 of the DUT 200, and the testing antenna 302 are turned on. The DUT 200 and the testing antenna 302 placed in the anechoic chamber 301 are rotated, and a phase difference of the receiving signals of the receiving antennas 204 at each angle before and after the rotation is obtained. The phase difference information between the receiving antenna 2041 and the receiving antenna 2042 can be directly obtained by reading the reports from the receiver 2051 and the receiver 2052. The obtained phase difference information between the receiving antenna 2041 and the receiving antenna 2042 is equal to the phase difference information between the transmitting antenna 2011 and the transmitting antenna 2012. The DUT 200 and the testing antennas 302 can be rotated repeatedly according to the testing requirements.

With the above method, the antenna gain information of the transmitting antenna 2011 and the transmitting antenna 2012 of the DUT 200 is obtained, and the phase difference information between the transmitting antenna 2011 and the transmitting antenna 2012 before the rotation and the phase difference information between the transmitting antenna 2011 and the transmitting antenna 2012 after rotation are obtained, the antenna pattern information of the transmitting antenna 201 is obtained according to the above information, and the obtained antenna pattern information is imported into the channel emulator 304.

At block 102, a same number of testing antennas 302 in the anechoic chamber 301 as a number of the transmitting antennas 201 of the DUT 200 is selected, so that the transmitting antennas 201 of the DUT 200 transmit signals to the selected testing antennas 302 to generate a propagation channel matrix from output ports of the transmitting antennas 201 of the DUT 200 to input ports 303 of the selected testing antennas.

Figure 7:
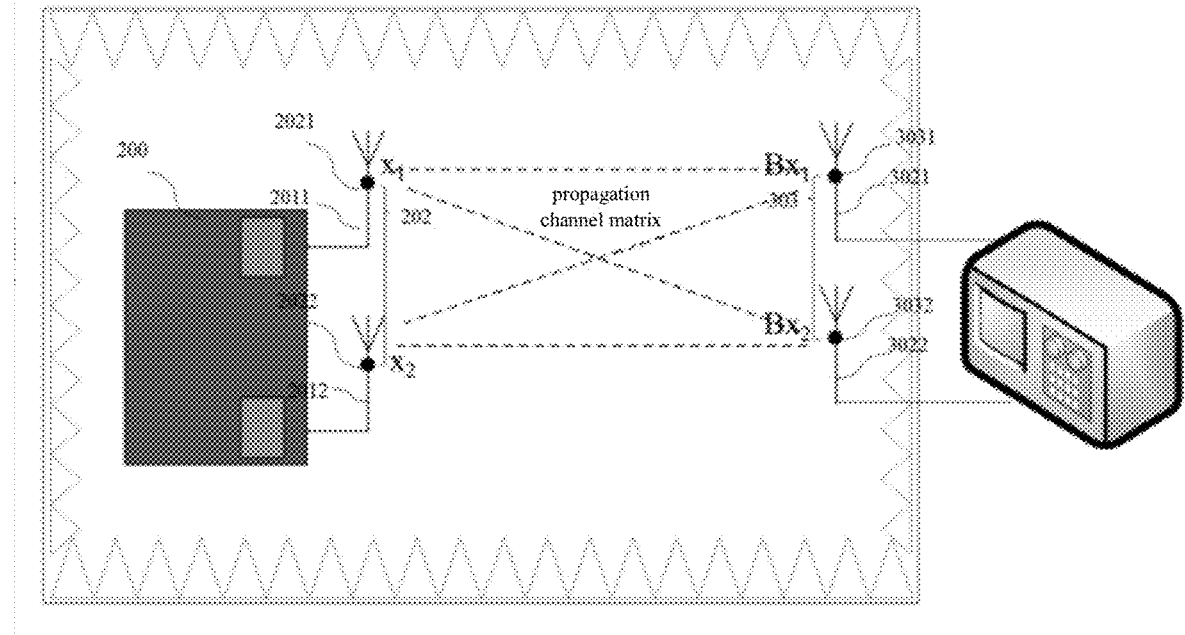
FIG. 7 is a schematic diagram of a propagation channel matrix according to an embodiment of the present disclosure.

In detail, as illustrated in FIG. 7, a 2×2 MIMO wireless terminal is taken as an example of the DUT 200. The DUT 200 has two transmitting antennas 2011 and 2012. Meanwhile, the same number of testing antennas 302 as the number of the transmitting antennas 201 are selected, i.e., a testing antenna 3021 and a testing antenna 3022 are selected. When the transmitting antenna 201 transmits a signal to the selected testing antenna 302, the signal sent by the transmitting antenna 201 can be received by any selected testing antenna 302. That is, a signal sent by the transmitting antenna output port 2021 can be received by a testing antenna input port 3031 and a testing antenna input port 3032, and a signal sent by the transmitting antenna output port 2022 can be received by the testing antenna input port 3031 and the testing antenna input port 3032. Therefore, during the signal propagation process, a propagation channel matrix for signal propagation is generated, as illustrated by the dashed part in FIG. 7.

The present disclosure summarizes the law of signal propagation, and expresses the propagation channel matrix of signal propagation with the following formula (4):

$$A = \begin{bmatrix} a_{11}e^{j\varphi_{11}} & a_{12}e^{j\varphi_{12}} \\ a_{21}e^{j\phi_{21}} & a_{22}e^{j\varphi_{22}} \end{bmatrix} \qquad (4)$$

$a_{xy}$ represents an amplitude change from a y-th output port of the transmitting antennas 201 of the DUT to an x-th input port 303 of the testing antennas, $\varphi_{xy}$ represents a phase change from the y-th output port of the transmitting antennas 201 of the DUT to the x-th input port 303 of the testing antennas, A is the propagation channel matrix.

Further, at block 103, an input port 303 of the selected testing antennas receives a transmitting antenna output port signal from the output port 202 of the transmitting antennas of the DUT 200 to generate a testing antenna input port signal and transmits the testing antenna input port signal to the channel emulator 304, such that the channel emulator 304 receives the testing antenna input port signal and processes the testing antenna input port signal to obtain an analog signal and send the analog signal to an analog base station 305.

Figure 8:
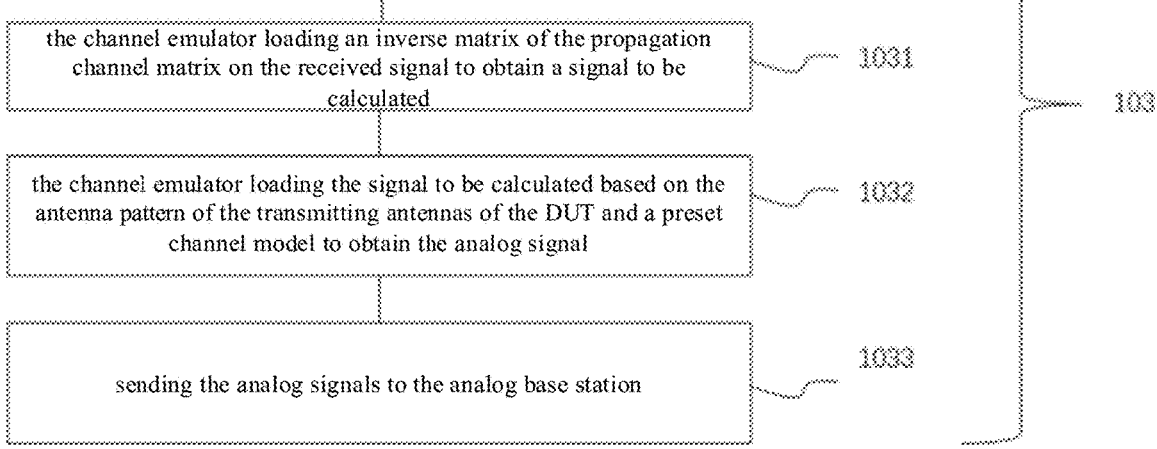
FIG. 8 is a flowchart of a method for testing wireless performance of a wireless terminal according to another embodiment of the present disclosure.
Figure 9:
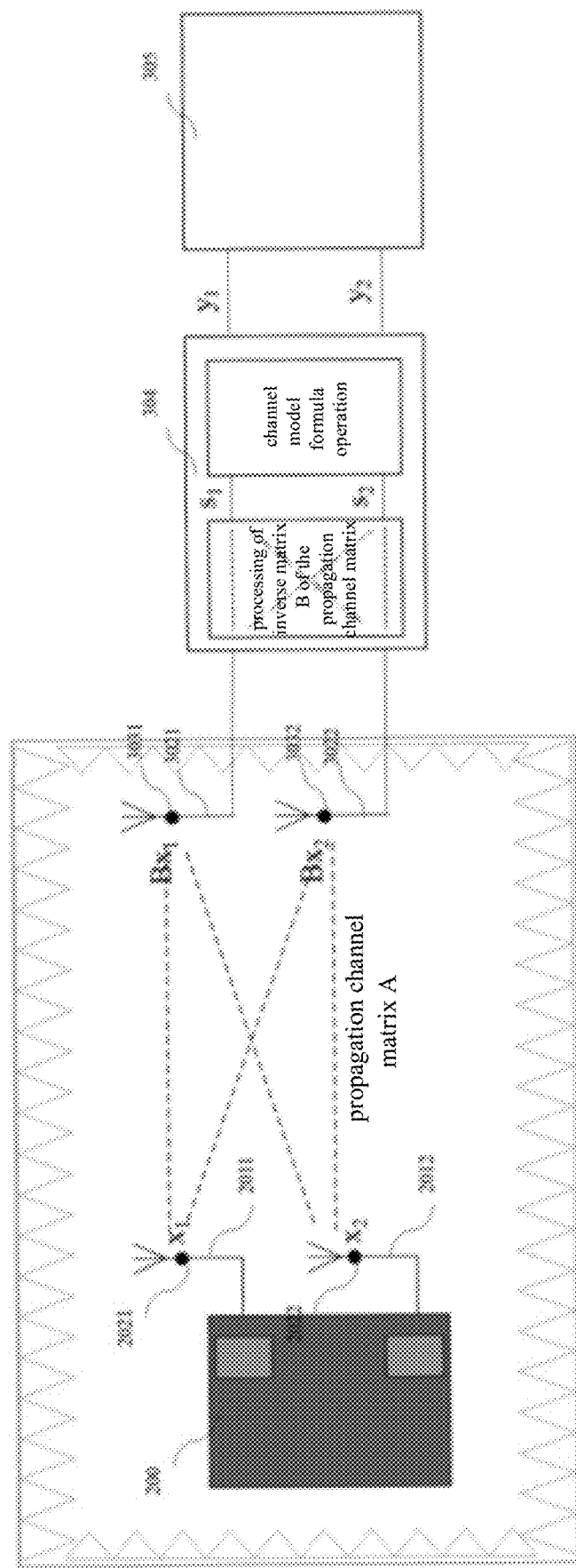
FIG. 9 is a schematic diagram of a method for testing wireless performance of a wireless terminal according to an embodiment of the present disclosure.

In detail, as illustrated in FIGS. 8-9, a 2×2 MIMO wireless terminal is taken as an example of the DUT 200. The DUT 200 has two transmitting antennas 201 (the transmitting antenna 2011 and the transmitting antenna 2012), the transmitting antenna 2011 has a transmitting antenna output port 2021, and the transmitting antenna 2012 has a transmitting antenna output port 2022. Meanwhile, the same number of testing antennas 302 as the number of the transmitting antenna 201 are selected, that is, the testing antenna 3021 and the testing antenna 3022 are selected. The testing antenna 3021 has a testing antenna input port 3031 and the testing antenna 3022 has a test antenna input port 3032.

As illustrated in FIG. 9, the testing antenna input port 3031 receives the transmitting antenna output port signals $x_1$ and $x_2$ transmitted from the transmitting antenna output port 2021 and the transmitting antenna output port 2022 of the DUT 200, and generates the testing antenna input port signal $Bx_1$. At the same time, the testing antenna input port 3032 receives the transmitting antenna output port signals $x_1$ and $x_2$ from the transmitting antenna output port 2021 and the transmitting antenna output port 2022 of the DUT 200, and generates the testing antenna input port signal $Bx_2$. The above signals are generated because the propagation channel matrix A is generated during the propagation process. Under the influence of the propagation channel matrix A, the transmitting antenna output port signals ($x_1$, $x_2$) and the testing antenna input port signals ($Bx_1$,$Bx_2$) satisfy the following relation of formula (5).

$$(Bx_1,Bx_2)^T=A*(x_1,x_2)^T \qquad (5)$$

As illustrated in FIG. 8, in a case where the above formula (5) is satisfied, the testing antenna input port 303 send the testing antenna input port signals ($Bx_1$, $Bx_2$) to the channel emulator 304. The channel emulator 304 performs subsequent process on the received testing antenna input port signals ($Bx_1$, $Bx_2$), the processing steps includes the followings.

C101: at block 1031, the channel emulator 304 loads an inverse matrix B of a propagation channel matrix on the received testing antenna input port signals ($Bx_1$,$Bx_2$) to obtain signals to be calculated ($s_1$,$s_2$), formula (6) is provided as follows.

$$(s_1,s_2)^T=B*(Bx_1,Bx_2)^T \qquad (6)$$

The propagation channel matrix is unavoidable. The purpose of eliminating the propagation channel matrix can be achieved by loading an inverse matrix B of the propagation channel matrix.

C102: at block 1032, the channel emulator 304 loads a channel model formula operation on the signals to be calculated ($s_1$,$s_2$) based on the antenna pattern information of the transmitting antennas 201 of the DUT 200 and a preset standard to obtain the analog signals ($y_1$,$y_2$).

In detail, when performing the formula operation for loading the channel model, the antenna pattern information of the transmitting antenna 201 of the DUT 200 required for the operation is obtained at block 101 and imported into the channel emulator 304. The preset standard includes the channel model and receiving pattern information of the base station, which are standard data known in the related art. The channel emulator 304 combines the imported antenna pattern information of the transmitting antennas 201 of the DUT 200 and the preset standard to load the channel model formula operation on the signals to be calculated ($s_1$, $s_2$). The related channel model operation formula includes formulas (7) to (9), formulas (7) to (9) belong to the existing standard calculation formulas:

$$(y_1,y_2,\ldots Y_U)^T=H(t)*(x_1,x_2,\ldots x_S)^T \qquad (7)$$

The above formula indicates the signals ($x_1,x_2,\ldots x_S$) from the S transmitting antenna output ports 202 of the S×U MIMO wireless terminal (i.e., the DUT 200) to the signals ($y_1,y_2,\ldots Y_U$) of the U ports of the analog base station 305.

H(t) is a U×S channel model, an element $h_{u,s}(t)$ in row u and column s may be represented as:

$$h_{u,s}(t) = \sum_{n=1}^{N} h_{n,u,s}(t) \qquad (8)$$

where, $h_{n,u,s}(t)$ is the $n^{th}$ element of the $h_{u,s}(t)$, which represents a propagation path of the $$h_{n,u,s}(t) = \sum_{m=1}^{M} e^{-j2\pi\lambda^{-1}D_S^{rx}(\Omega_m^{rx})} * e^{-j2\pi\lambda^{-1}D_u^{rx}(\Omega_n^{rx})} * \qquad (9)$$

$$e^{-jkvt} * \begin{bmatrix} F_u^{rx(V)}(\Omega_n^{rx}) \\ F_u^{rx(H)}(\Omega_n^{rx}) \end{bmatrix}^T * \begin{bmatrix} x_{n,m}^{V,V} & x_{n,m}^{V,H} \\ x_{n,m}^{H,V} & x_{n,m}^{H,H} \end{bmatrix} * \begin{bmatrix} F_s^{tx(V)}(\Omega_m^{tx}) \\ F_s^{tx(H)}(\Omega_m^{tx}) \end{bmatrix}$$

$F_s^{tx(V)}$ and $F_s^{tx(H)}$ are gain information of the $s^{th}$ transmitting antenna 201 of the DUT 200, $x_{n,m}^{V,V}$, $x_{n,m}^{V,H}$, $x_{n,m}^{H,V}$, $x_{n,m}^{H,H}$ are the channel model complex gain, $F_u^{rx(V)}$ and $F_u^{rx(H)}$ are the $u^{th}$ receiving antenna gain of the analog base station 305, $\Omega_m^{tx}$ and $\Omega_n^{rx}$ are a starting angle of the transmitting signal of the transmitting antenna 201 and a receiving angle of the receiving signal of the testing antenna 302, $D_S^{tx}(\Omega_m^{tx})$ and $D_u^{rx}(\Omega_n^{rx})$ are phase shift of the signal transmitted from the transmitting antenna 201 and phase shift of the signal received by the testing antenna 302, A is a wavelength, and kv represents Doppler effect.

The channel emulator 304 loads the above channel model formula operation on the signals to be calculated ($s_1$,$s_2$) based on the imported antenna pattern information of the transmitting antennas 201 of the DUT 200 and the preset standard to obtain the analog signals ($y_1$,$y_2$). The related formula is:

$$(y_1,y_2)^T=H(t)(s_1,s_2)^T \qquad (10)$$

$$\text{let } B*A=I \qquad (11)$$

I is an identity matrix, H(t) is a channel model, by combining formulas (5) (6) (10) and (11)

$$(y_1,y_2)^T=H(t)*(x_1,x_2)^T \qquad (12)$$

C103: at block 1033, the analog signals ($y_1$,$y_2$) is transmitted to the analog base station 305.

Figure 10:
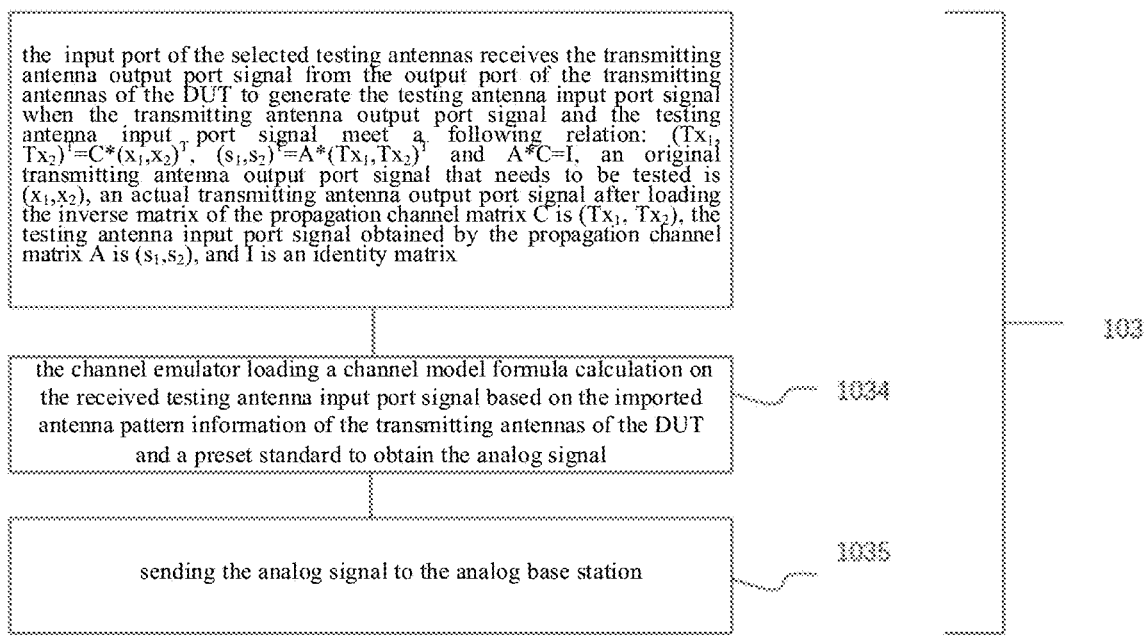
FIG. 10 is a flowchart of a method for testing wireless performance testing of a wireless terminal according to another embodiment of the present disclosure.
Figure 11:
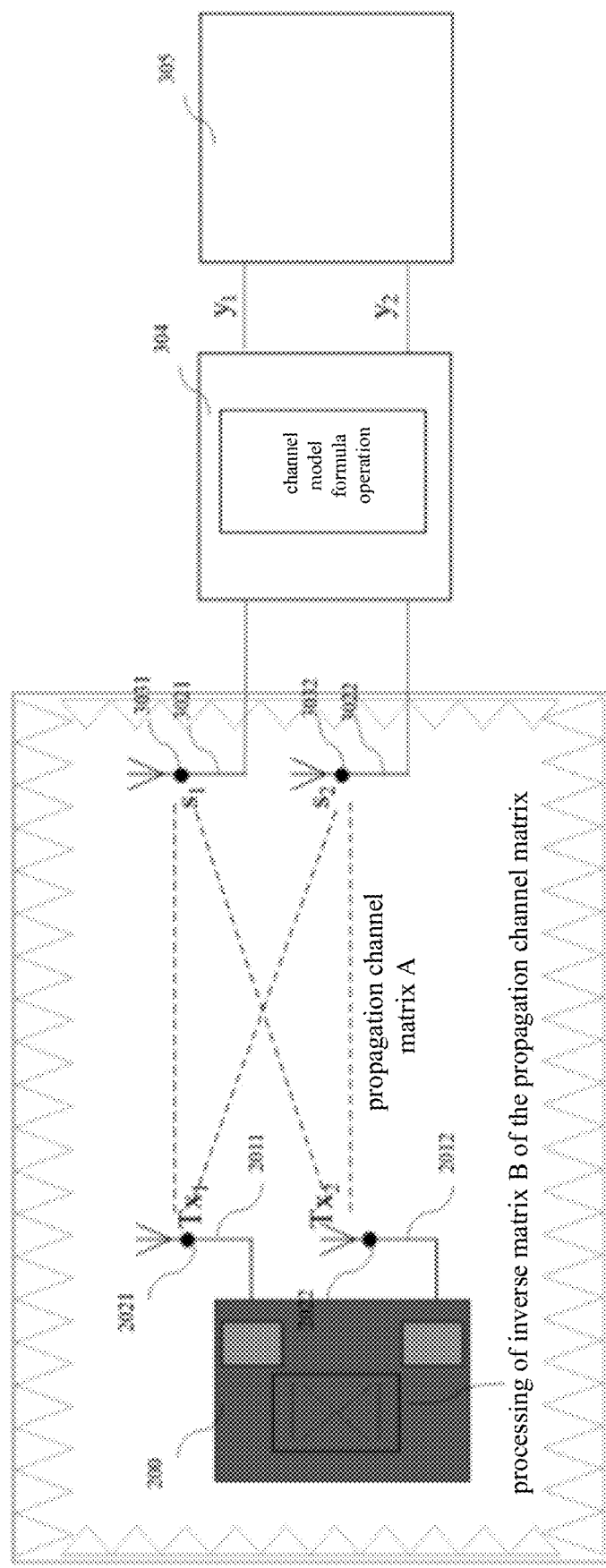
FIG. 11 is a schematic diagram of a method for testing wireless performance of a wireless terminal according to another embodiment of the present disclosure.

In some embodiments, as illustrated in FIGS. 10-11, a 2×2 MIMO wireless terminal is taken as an example of the DUT 200. The DUT 200 has two transmitting antennas 201 (the transmitting antenna 2011 and the transmitting antenna 2012), the transmitting antenna 2011 has a transmitting antenna output port 2021, and the transmitting antenna 2012 has a transmitting antenna output port 2022. Meanwhile, the same number of testing antennas 302 as the number of the transmitting antennas 201 are selected, that is, the testing antenna 3021 and the testing antenna 3022 are selected. The testing antenna 3021 has a testing antenna input port 3031 and the testing antenna 3022 has a test antenna input port 3032.

As illustrated in FIG. 11, original transmitting antenna output port signals to be tested are $(x_1,x_2)$, but the DUT 200 first loads the transmitting antenna output port signals with an inverse matrix C of the propagation channel matrix before the signals are transmitted, and then actual transmitting antenna output port signals, i.e., loaded signals, are $(Tx_1,Tx_2)$. After the transmitting antenna 201 sends the actual transmitting antenna output port signals $(Tx_1,Tx_2)$ to the testing antenna 302, the testing antenna input port 3031 receives the transmitting antenna output port signals $Tx_1$ and $Tx_2$ transmitted by the transmitting antenna output port 2021 and the transmitting antenna output port 2022, and a testing antenna input port signal $S_1$ is generated under effect of the propagation channel matrix A. Meanwhile, the testing antenna input port 3032 receives the transmitting antenna output port signals $Tx_1$ and $Tx_2$ transmitted by the transmitting antenna output port 2021 and the transmitting antenna output port 2022, and a testing antenna input port signal $S_2$ is generated under the effect of the propagation channel matrix A. At this time, the original transmitting antenna output port signals to be tested $(x_1, x_2)$, the actual transmitting antenna output port signals $(Tx_1,Tx_2)$ and the testing antenna input port signals $(Bx_1,Bx_2)$ satisfy the following relation illustrated as formulas (13)-(15):

$$(Tx_1,Tx_2)^T = C*(x_1,x_2)^T \tag{13}$$

$$(s_1,s_2)^T = A*(Tx_1,Tx_2)^T \tag{14}$$

$$\text{and } A*C = I \tag{15}$$

The propagation channel matrix is unavoidable, so the purpose of eliminating the propagation channel matrix can be achieved by loading the inverse matrix of the propagation channel matrix to the transmitted signals before the signals are transmitted.

It should be noted that the inverse matrix C of the propagation channel matrix and the aforementioned inverse matrix B of the propagation channel matrix may be the same inverse matrix of the propagation channel matrix, or may be different inverse matrixes of the propagation channel matrix, such as a left inverse matrix and a right inverse matrix of the propagation channel matrix, respectively.

As illustrated in FIG. 10, when the above formulas (13) to (15) are satisfied, the testing antenna input port 303 sends the testing antenna input port signals $(s_1,s_2)$ to the channel emulator 304. The channel emulator 304 receives the testing antenna input port signals $(s_1,s_2)$ and performs subsequent processing on the signal. The subsequent processing includes the followings.

C201: at block 1034, the channel emulator 304 loads a channel model formula operation on the signals to be calculated $(s_1,s_2)$ based on the imported antenna pattern information of the transmitting antennas 201 of the DUT 200 and a preset standard to obtain the analog signals $(y_1,y_2)$.

In detail, during loading the channel model formula operation, the antenna pattern information of the transmitting antennas 201 of the DUT 200 required for the operation is obtained at block 101 and imported into the channel emulator 304. The preset standards include a channel model and base station receiving pattern information, which are standard data known in the related art. The channel emulator 304 combines the imported antenna pattern information of the transmitting antennas 201 of the DUT 200 and the preset standard to load the channel model formula operation on the signals to be calculated $(s_1,s_2)$. The related channel model operation formula includes formulas (7)-(9). The related formulas are not repeated here. Finally, the analog signals $(y_1,y_2)$ can be obtained, and a relevant formula is:

$$(y_1,y_2)^T = H(t)*(s_1,s_2)^T \tag{16}$$

By combining formulas (13)-(16), $$(y_1,y_2)^T = H(t)*(x_1,x_2)^T \tag{17}$$

C202: at block 1035, the analog signal $(y_1,y_2)$ is transmitted to the analog base station 305.

Comparing FIGS. 8 and 9 with FIGS. 10 and 11, the two methods can be summarized as follows. The former is that the testing antenna input port 303 receives the transmitting antenna output port signals $(x_1,x_2)$ and generates the testing antenna input port signals $(Bx_1,Bx_2)$, the channel emulator 304 loads the inverse matrix of the propagation channel matrix on the testing antenna input port signals $(Bx_1,Bx_2)$ to obtain the signals to be calculated $(s_1, s_2)$ and loads the channel model formula operation on the signal to obtain the analog signals $(y_1,y_2)$. The latter is that the DUT 200 loads the inverse matrix of the propagation channel matrix on the transmitting antenna output port signals $(x_1, x_2)$ that needs to be tested to obtain the actual transmitting antenna output port signals $(Tx_1,Tx_2)$, the testing antenna input port 303 receives the actual transmitting antenna output port signals $(Tx_1,Tx_2)$ and generates the testing antenna input port signals $(s_1,s_2)$, the channel emulator 304 loads the channel module formula operation on the testing antenna input port signals $(s_1,s_2)$ to obtain the analog signals $(y_1,y_2)$. For the two methods, the step of loading the inverse matrix of the propagation channel matrix is after the DUT transmits the signal in one method, and is before the DUT transmits the signal in another method, but the analog signals $(y_1,y_2)$ obtained by the two are identical.

Further, as shown in FIGS. 9 and 11, at block 104, the analog base station 305 receives the analog signals $(y_1,y_2)$ and performs a throughput test to implement an uplink wireless performance test on the DUT 200.

With the method for testing wireless performance of the wireless terminal according to an embodiment of the present disclosure, the analog signals $(y_1,y_2)$ received by the analog base station 305 fully complies with MIMO OTA test requirements of the channel model. This method achieves uplink wireless performance testing of the MIMO wireless device. This method is advanced and can implement uplink MIMO throughput test in a common SISO anechoic chamber.

The present disclosure provides a new method and system for testing uplink wireless performance of the wireless terminal, which can ensure accuracy and convenience of the test, and are simple to implement and low in cost.

The present disclosure has the following advantages.

(1) In the present disclosure, the throughput test is performed in the anechoic chamber, and the tested transmitting signal is loaded through an air interface. There is no need to take the DUT out of the anechoic chamber and connect it with a cable. This makes the testing process a continuous process and the operation process is very convenient.

(2) This method is advanced and can achieve uplink MIMO throughput test in a common SISO anechoic chamber. The cost of system upgrade is low. Moreover, the cost of building a new measurement system is low.

(3) The test may not only obtain the antenna pattern information of the wireless terminal under test, but also may perform the throughput test, thus not only meeting the requirements of the MIMO terminal research and development process, but also can be used as the final throughput test.

(4) Different MIMO spatial propagation models can be simulated with high flexibility.

A system for testing wireless performance of a wireless terminal according to an embodiment of the second aspect of the present disclosure is described below with reference to the drawings.

Figure 12:
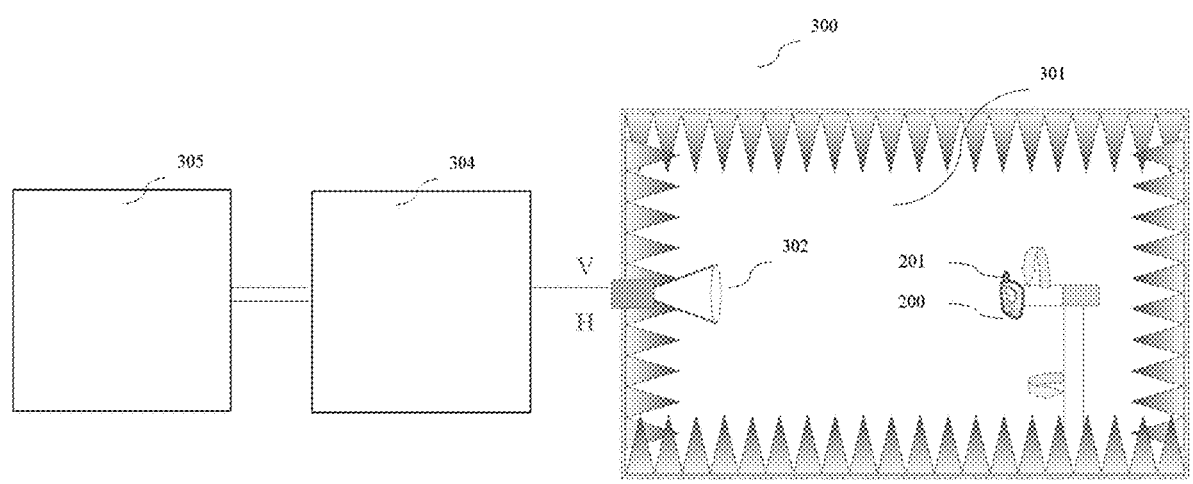
FIG. 12 is a schematic diagram of a system for testing wireless performance of a wireless terminal according to an embodiment of the present disclosure.

As illustrated in FIG. 12, the system for testing wireless performance of a wireless terminal includes an anechoic chamber 301, testing antennas 302, a channel emulator 304, and an analog base station 305.

The anechoic chamber 301 is configured to place the testing antennas and a device under test.

The testing antennas 302 has a testing antenna input port 303, and are configured to receive a transmitting antenna output port signal transmitted by a transmitting antenna output port 202 of a transmitting antenna 202 of the device under test 200 via the testing antenna input port 303.

The channel emulator 304 is configured to receive a testing antenna input port signal transmitted by a testing antenna input port 303 of a selected testing antenna 302, process the signal based on antenna pattern information of the transmitting antenna 201 of the device under test 200 and a preset standard to obtain an analog signal, and send the analog signal to the analog base station 305.

The analog base station 305 is configured to receive the analog signal, perform a throughput test, and implement an uplink wireless performance test on the device under test 200.

It is noted that the channel emulator 304 and the analog base station 305 may be integrated in one testing instrument, or may constitute a plurality of testing instruments respectively. As illustrated in FIG. 12, the channel emulator 304 and the analog base station 305 respectively constitute a plurality of testing instruments. As illustrated in FIGS. 5 and 6, the channel emulator 304 and the analog base station 305 are integrated in one test instrument.

In some embodiments, the system further includes a DUT controller. The DUT controller is configured to load an inverse matrix of a propagation channel matrix on an original transmitting signal to get a loaded signal, and transmit the loaded signal by the transmitting antenna 202 of the DUT 200. The channel emulator 304 is configured to receive a signal from the testing antennas 302, process the signal to obtain an analog signal by calculating the received signal based on an antenna pattern of the transmitting antennas 202 of the DUT 200 and a preset channel model.

The present disclosure further provides a non-transitory computer-readable storage medium, having stored therein instructions that, when executed by a processor, causes the processor to perform the method for testing wireless performance of a wireless terminal according to the above embodiments. The wireless terminal is configured as a device under test (DUT), the DUT has a plurality of transmitting antennas and is placed in an anechoic chamber.

The present disclosure provides a new method and system for testing uplink wireless performance of the wireless terminal, which can ensure accuracy and convenience of the test, and are simple to implement and low in cost.

The present disclosure has the following advantages.

(1) In the present disclosure, the throughput test is performed in the anechoic chamber, and the tested transmitting signal is loaded through an air interface. There is no need to take the DUT out of the anechoic chamber and connect it with a cable. This makes the testing process a continuous process and the operation process is very convenient.

(2) This method is advanced and can achieve uplink MIMO throughput test in a common SISO anechoic chamber. The cost of system upgrade is low. Moreover, the cost of building a new measurement system is low.

(3) The test may not only obtain the antenna pattern information of the wireless terminal under test, but also may perform the throughput test, thus not only meeting the requirements of the MIMO terminal research and development process, but also can be used as the final throughput test.

(4) Different MIMO spatial propagation models can be simulated with high flexibility.

Various implementations of the systems and technologies described herein can be implemented in a digital electronic circuit system, an integrated circuit system, an application-specific ASIC (application-specific integrated circuit), computer hardware, firmware, software, and/or combinations thereof. These various embodiments may include: being implemented in one or more computer programs, the one or more computer programs may be executed and/or interpreted on a programmable system including at least one programmable processor, the programmable processor may be a dedicated or general-purpose programmable processor that can receive data and instructions from a storage system, at least one input device, and at least one output device, and transmit the data and instructions to the storage system, the at least one input device, and the at least one output device.

These computing programs (also called programs, software, software applications, or codes) include machine instructions for the programmable processors, and high-level processes and/or object-oriented programming languages, and/or assembly/machine language may be utilized to implement these calculation programs. As used herein, the terms "machine-readable medium" and "computer-readable medium" refer to any computer program product, apparatus, and/or device used to provide machine instructions and/or data to the programmable processor, such as, magnetic disks, optical disks, memory, programmable logic devices (PLD), including machine-readable media that receive machine instructions as machine-readable signals. The term "machine-readable signal" refers to any signal used to provide machine instructions and/or data to a programmable processor.

It should be understood that the various forms of flows shown above can be used to reorder, add, or delete steps. For example, the steps disclosed in the present application can be executed in parallel, sequentially, or in different orders. As long as the desired results of the technical solutions disclosed in the present application can be achieved, there is no limitation herein.

The foregoing specific embodiments do not constitute a limitation on the protection scope of the present application. It should be understood by those skilled in the art that various modifications, combinations, sub-combinations, and substitutions may be made according to design requirements and other factors. Any modification, equivalent replacement and improvement made within the spirit and principle of this application shall be included in the protection scope of this application.

What is claimed is:

1. A method for testing wireless performance of a wireless terminal, wherein the wireless terminal is configured as a device under test (DUT), the DUT has a plurality of transmitting antennas and is placed in an anechoic chamber, and the method comprises:

obtaining antenna pattern of the plurality of the transmitting antennas of the DUT, and importing the antenna pattern into a channel emulator;

selecting a same number of testing antennas in the anechoic chamber as a number of the transmitting antennas of the DUT, so that the transmitting antennas of the DUT transmit signals to the selected testing antennas to generate a propagation channel matrix between the transmitting antennas of the DUT and the selected testing antennas;

wherein the propagation channel matrix is eliminated during signal transmission from the DUT to an analog base station by: the DUT loading an inverse matrix of the propagation channel matrix on original signals to get loaded signals, the transmitting antennas of the DUT transmitting the loaded signals to the selected testing antennas, the selected testing antennas receiving signals from the transmitting antennas of the DUT, sending the received signals to the channel emulator, and the channel emulator processing the received signals based on the antenna pattern and a preset channel model to generate an analog signal and sending the analog signal to an analog base station; and the analog base station receiving the analog signal and performing a throughput test to obtain an uplink wireless performance of the DUT.

2. The method according to claim 1, wherein the antenna pattern of the transmitting antennas comprises antenna gain information and phase difference information.

3. The method according to claim 1, obtaining the antenna pattern of the transmitting antennas comprising:

testing a receiving antenna of the DUT and obtaining the antenna pattern, wherein the antenna pattern of the transmitting antenna is identical to the antenna pattern of the receiving antenna for a wireless terminal that transmits and receives signals at a same frequency.

4. The method according to claim 1, wherein a signal from the transmitting antennas of the DUT is able to be received by any selected testing antennas.

5. The method according to claim 1, wherein when the DUT is a 2×2 MIMO wireless terminal, the propagation channel matrix is:

$$A = \begin{bmatrix} a_{11}e^{j\varphi_{11}} & a_{12}e^{j\varphi_{12}} \\ a_{21}e^{j\varphi_{21}} & a_{22}e^{j\varphi_{22}} \end{bmatrix}$$

$a_{xy}$ represents an amplitude change from a y-th transmitting antenna of the DUT to an x-th testing antenna, $\varphi_{xy}$ represents a phase change from the y-th transmitting antenna of the DUT to the x-th testing antenna, A represents the propagation channel matrix.

6. The method according to claim 1, wherein the original signals, the loaded signals, the signals received by the selected testing antennas, the propagation channel matrix and the inverse matrix of the propagation channel matrix meet a following relation:

$$(Tx_1, Tx_2)^T = C*(x_1, x_2)^T$$

$$(s_1, s_2)^T = A*(Tx_1, Tx_2)^T$$

and $A*C = I$ $(x_1, x_2)$ represents the original signals, $(Tx_1, Tx_2)$ represents the loaded signals, $(s_1, s_2)$ represents the signals received by the selected testing antennas, C represents the inverse matrix of the propagation channel matrix, A represents the propagation channel matrix, I represents an identity matrix.

7. A system for testing wireless performance of a wireless terminal, comprising an anechoic chamber, testing antennas, a channel emulator, an analog base station, and a DUT controller, wherein:

the anechoic chamber is configured to place the testing antennas and a device under test (DUT);

the testing antennas are configured to receive a-signals transmitted by a-transmitting antennas of the DUT, and sending the received signals to the channel emulator;

the testing instrument is configured to obtain antenna pattern of a plurality of transmitting antennas of the DUT, import the antenna pattern into the channel emulator, select a same number of testing antennas in the anechoic chamber as a number of the transmitting antennas of the DUT, so that the transmitting antennas of the DUT transmit signals to the selected testing antennas to generate a propagation channel matrix between the transmitting antennas of the DUT and the selected testing antennas;

the DUT controller is configured to control the DUT to load an inverse matrix of the propagation channel matrix on original signals to get loaded signals and transmit the loaded signals to the selected testing antennas through the transmitting antennas of the DUT;

the channel emulator is configured to receive signals from the testing antennas, process the received signals based on the antenna pattern and a preset channel model to obtain an analog signal, and send the analog signal to the analog base station; and the analog base station is configured to receive the analog signal, and perform a throughput test to obtain an uplink wireless performance of the DUT.

8. The system according to claim 7, wherein the channel emulator and the analog base station are integrated into one test instrument, or constitute a plurality of test instruments respectively.

9. A non-transitory computer-readable storage medium, having stored therein instructions that, when executed by a processor, causes the processor to perform a method for testing wireless performance of a wireless terminal, wherein the wireless terminal is configured as a device under test (DUT), the DUT has a plurality of transmitting antennas and is placed in an anechoic chamber, and the method comprises:

obtaining antenna pattern of the plurality of the transmitting antennas of the DUT, and importing the antenna pattern into a channel emulator;

selecting a same number of testing antennas in the anechoic chamber as a number of the transmitting antennas of the DUT, so that the transmitting antennas of the DUT transmit signals to the selected testing antennas to generate a propagation channel matrix between the transmitting antennas of the DUT and the selected testing antennas;

wherein the propagation channel matrix is eliminated during signal transmission from the DUT to an analog base station by: the DUT loading an inverse matrix of the propagation channel matrix on original signals to get loaded signals, the transmitting antennas of the DUT transmitting the loaded signals to the selected testing antennas, the selected testing antennas receiving signals from the transmitting antennas of the DUT, sending the received signals to the channel emulator, and the channel emulator processing the received signals based on the antenna pattern and a preset channel model to generate an analog signal and sending the analog signal to an analog base station; and the analog base station receiving the analog signal and performing a throughput test to obtain an uplink wireless performance of the DUT.

10. The storage medium according to claim 9, wherein the antenna pattern of the transmitting antennas comprises antenna gain information and phase difference information.

11. The storage medium according to claim 9, obtaining the antenna pattern of the transmitting antennas comprising:
testing a receiving antenna of the DUT and obtaining the antenna pattern, wherein the antenna pattern of the transmitting antenna is identical to the antenna pattern of the receiving antenna for a wireless terminal that transmit and receive signals at a same frequency.

12. The storage medium according to claim 9, wherein when the DUT is a 2×2 MIMO wireless terminal, the propagation channel matrix is:

$$A = \begin{bmatrix} a_{11}e^{j\varphi_{11}} & a_{12}e^{j\varphi_{12}} \\ a_{21}e^{j\varphi_{21}} & a_{22}e^{j\varphi_{22}} \end{bmatrix}$$

$a_{xy}$ represents an amplitude change from a y-th transmitting antenna of the DUT to an x-th testing antenna, $\varphi_{xy}$ represents a phase change from the y-th transmitting antenna of the DUT to the x-th testing antenna, A represents the propagation channel matrix.

13. The storage medium according to claim 9, wherein a signal from the transmitting antennas of the DUT is able to be received by any selected testing antennas.

14. The storage medium according to claim 9, wherein the original signals, the loaded signals, the signals received by the selected testing antennas, the propagation channel matrix and the inverse matrix of the propagation channel matrix meet a following relation:

$$(Tx_1, Tx_2)^T = C*(x_1, x_2)^T$$

$$(s_1, s_2)^T = A*(Tx_1, Tx_2)^T$$

and $A*C=I$ $(x_1, x_2)$ represents the original signals, $(Tx_1, Tx_2)$ represents the loaded signals, $(s_1, s_2)$ represents the signals received by the selected testing antennas, C represents the inverse matrix of the propagation channel matrix, A represents the propagation channel matrix, I represents an identity matrix.

* * * * *